United States Patent [19]

Honda et al.

[11] Patent Number: 5,597,678
[45] Date of Patent: * Jan. 28, 1997

[54] NON-CORROSIVE PHOTORESIST STRIPPER COMPOSITION

[75] Inventors: Kenji Honda, Barrington; Donald F. Perry, North Providence; Taishih Maw, Cumberland, all of R.I.

[73] Assignee: OCG Microelectronic Materials, Inc., West Paterson, N.J.

[ * ] Notice: The term of this patent shall not extend beyond the expiration date of Pat. No. 5,472,830.

[21] Appl. No.: 499,808

[22] Filed: Jul. 7, 1995

Related U.S. Application Data

[63] Continuation-in-part of Ser. No. 228,775, Apr. 18, 1994, Pat. No. 5,472,830, and Ser. No. 436,548, May 8, 1995, Pat. No. 5,545,353.

[51] Int. Cl.$^6$ .............................. G03C 5/00; C11D 7/06
[52] U.S. Cl. .................... 430/331; 430/256; 430/258; 510/176
[58] Field of Search .................... 430/331, 256, 430/258; 252/156, 158, 548

[56] References Cited

U.S. PATENT DOCUMENTS

| | | | |
|---|---|---|---|
| 4,617,251 | 10/1986 | Sizensky et al. | 430/256 |
| 4,770,713 | 9/1988 | Ward | 134/38 |
| 4,786,578 | 11/1988 | Neisius et al. | |
| 4,824,762 | 4/1989 | Kobayashi et al. | 430/258 |
| 4,824,763 | 4/1989 | Lee | 430/258 |
| 4,904,571 | 2/1990 | Miyashita et al. | |
| 5,279,771 | 1/1994 | Lee | |
| 5,334,332 | 8/1994 | Lee | 252/548 |
| 5,417,877 | 5/1995 | Ward | 252/153 |
| 5,419,779 | 5/1995 | Ward | 134/38 |
| 5,472,830 | 12/1995 | Honda | 430/331 |

FOREIGN PATENT DOCUMENTS

| | | |
|---|---|---|
| 3828513 | 3/1990 | Germany . |
| 56-115368 | 9/1981 | Japan . |
| 63-208043 | 8/1988 | Japan . |
| 1-081949 | 3/1989 | Japan . |
| 64-088548 | 4/1989 | Japan . |
| 4-124668 | 4/1992 | Japan . |
| 4-350660 | 12/1992 | Japan . |
| 5-045894 | 2/1993 | Japan . |

*Primary Examiner*—Mark Chapman
*Attorney, Agent, or Firm*—William A. Simons

[57] ABSTRACT

A non-corrosive positive photoresist stripper composition comprising:

(a) a solvent selected from N-methyl-2-pyrrolidone, N-hydroxyethyl-2-pyrrolidone, 1,3-dimethyl-2-imidazolidinone dimethylsulfoxide, and admixtures thereof;

(b) a corrosion inhibitor selected form tricine, bicine, (2-benzothiozolythio)succinic acid, and admixtures thereof;

(c) optionally, an alkanolamine selected from diethyleneglycolamine, monoethanolamine, diethanolamine, triethanolamine, and admixtures thereof;

(d) optionally, water; and (e) optionally, a water-soluble surface active compound.

4 Claims, No Drawings

NON-CORROSIVE PHOTORESIST STRIPPER COMPOSITION

CROSS-REFERENCE TO RELATED APPLICATIONS

The present patent application is a continuation-in-part application of U.S. patent application Ser. No. 08/228,775, filed on Apr. 18, 1994 with Kenji Honda as the named inventor now U.S. Pat. No. 5,472,830 and is a continuation-in-art application of U.S. patent application Ser. No. 08/436,548, filed on May 8, 1995 with Kenji Honda and Taishih Maw as the named inventors now U.S. Pat. No. 5,545,353. Both of these parent applications are incorporated herein by reference in their entireties.

BACKGROUND OF THE INVENTION

1. Field of the Invention

The present invention relates to a non-corrosive photoresist stripper composition containing a specific combination of (1) selected solvents; (2) a selected corrosion inhibitors.

2. Description of the Prior Art

The photoresist stripper art is replete with numerous references to stripper compositions containing both a polar solvent and an amine compound. The presence of an amine in photoresist stripper compositions has been judged to be essential to effectively remove cross-linked resist films. However, amine-type photoresist strippers sometimes have a serious problem of corrosion, especially with aluminum substrates.

It is believed that the corrosion is caused in part by the ionization of water with the amine in post-stripping water rinse, as residual stripper solution may be retained on the substrate surface and/or substrate carrier after the stripping step. In other words, the amine component of the stripper composition does not corrode the substrate by itself, but can trigger water to cause the corrosion.

To solve this problem, an intermediate rinse step with an organic solvent has been used between the stripping step and the post-stripping rinse with water. For example, isopropyl alcohol is known to be useful for this purpose. However, such intermediate rinses are not necessarily desirable because overall stripping operation becomes more complicated and, furthermore, an additional solvent waste is produced. Accordingly, if amine-type strippers are to be further employed, there is a need to solve this corrosion problem without intermediate organic solvent wastes.

In addition, there are other mechanisms of the metal corrosion; for example, metal halides such as aluminum chloride tend to be generated as a post-etch residue and these compounds could cause the corrosion in contact with water in the water rinse after the stripping process, if these compounds were not removed with stripper solutions. Another corrosion mechanism is observed especially with alloys such as Al-Cu-Si. This type of corrosion is usually observed in a local place; it is referred to as pitting. The pitting is considered to be caused by the galvanic type of the electrochemical reaction between two metals which have different electronegativities.

The present invention provides such a solution for all kinds of the corrosion mentioned above.

Illustrative of references suggesting photoresist stripper compositions containing the combination of a polar solvent and an amine compound are the following:

1. U.S. Pat. No. 4,617,251, which issued to Sizensky et al. (Olin Hunt) on Oct. 14, 1986, teaches a positive photoresist stripping composition containing (A) selected amine compound (e.g., 2-(2-aminoethoxy)-ethanol; 2-(2-aminoethylamino)-ethanol; and mixtures thereof) and (B) selected polar solvents (e.g., N-methyl-2-pyrrolidinone, tetrahydrofurfuryl alcohol, isophorone, dimethyl sulfoxide, dimethyl adipate, dimethyl glutarate, sulfolane, gamma-butyrolactone, N,N-dimethylacetamide and mixtures thereof). The reference further teaches that water as well as dyes or colorants, wetting agents, surfactants and antifoamers may be added into this composition.

2. U.S. Pat. No. 4,770,713, which issued to Ward (J. T. Baker) on Sep. 13, 1988, teaches a positive photoresist stripping composition containing (A) a selected amide (e.g., N,N-dimethyl acetamide; N-methyl acetamide; N,N-diethyl acetamide; N,N-dipropyl acetamide; N,N-dimethyl propionamide; N, N-diethyl butyramide and N-methyl-N-ethyl propionamide) and (B) selected amine compound (e.g., monoethanolamine, monopropanolamine, methyl-aminoethanol). The patent also teaches this stripper may optionally contain a water miscible nonionic detergent (e.g., alkylene oxide condensates, amides and semi-polar nonionics).

3. U.S. Pat. No. 4,786,578, which issued to Neisius et al. (Merck) on Nov. 22, 1988, teaches a rinse solution used after a photoresist stripper, said rinse solution containing (A) a nonionic surfactant (e.g., ethoxylated alkylphenol, fatty and ethoxylate, fatty alcohol ethoxylate or ethylene oxide/propylene oxide condensate) and (B) an organic base (e.g., mono-, di-, or tri-ethanolamine).

4. U.S. Pat. No. 4,824,762, which issued to Kobayashi et al. on Apr. 25, 1989, teaches photoresist stripping post-rinse solution containing (A) glycol ether (e.g., diethylene glycol monomethyl ether, dipropylene glycol monomethyl ether, tripropylene glycol monomethyl ether) and (B) an aliphatic amine (e.g., monoethanolamine or triisopropylamine).

5. U.S. Pat. No. 4,824,763, which issued to Lee (EKC) on Apr. 25, 1989, teaches positive-working photoresist stripping composition containing (A) triamine (e.g., diethylenetriamine) and (B) a polar solvent (e.g., N-methyl-2-pyrrolidone, dimethylformamide, butyrolactone, aliphatic hydrocarbons, aromatic hydrocarbons, chlorinated hydrocarbons).

6. U.S. Pat. No. 4,904,571, which issued to Miyashita et al. on Feb. 27, 1990, teaches printed circuit board photoresist stripper composition containing (A) a solvent (e.g., water, alcohols, ethers, ketones, chlorinated hydrocarbons and aromatic hydrocarbons); (B) an alkaline compound dissolved in said solvent (e.g., primary amines, secondary amines, tertiary amines, cyclic amines, polyamines, quaternary ammonium amines, sulfonium hydroxides, alkali hydroxides, alkali carbonates, alkali phosphates and alkali pyrophosphates); and (C) a borohydride compound dissolved in said solvent (e.g., sodium borohydride, lithium borohydride, dimethyl amine borone, trimethyl amine borone, pyridane borone, tert-butyl amine borone, triethyl amine borone, and morpholine borone).

7. U.S. Pat. No. 5,279,791, which issued to Lee (EKC) on Jan. 18, 1994, teaches a stripping composition for removing resists from substrates containing (A) hydroxylamine (e.g., $NH_2OH$); (B) at least one alkanolamine; and optionally (C) at least one polar solvent.

8. U.S. Pat. No. 5,334,332, which issued to Lee (EKC) on Aug. 2, 1994, teaches the use of ethylenediamine tetraacetic acid and 1,2-dihydrobenzene as a chelating reagent to reduce the surface metal contamination on wafers.

9. German Published Patent Application No. DE3828513, which issued to Schulz (Merck) on Mar. 1, 1990, teaches a positive and negative photoresist stripper composition containing (A) an aprotic polar solvent (e.g., 1,3-dimethyl-2-imidazolidinone or 1,3-dimethyl-tetrahydro-pyrimidinone); and (B) an organic base (e.g., alkanolamine).

10. Japanese Published Patent Application No. 56-115368, which was published on Sep. 10, 1981 and is assigned to San Ei Chemical Industries, KK, teaches a photoresist stripping composition containing (A) nonionic surface activator (e.g., a polyethylene glycol ether); (B) organic solvent (e.g., cyclohexanone); and (C) either a swelling agent (e.g., polyethylene glycol) or penetrant (e.g., 2-aminoethanol).

11. Japanese Published Patent Application No. 63-208043, which issued to R. Ohtani (Kanto Chemical) on August 29, 1988, teaches a positive-working photoresist stripper composition containing (A) 1,3-dimethyl-2-imidazolidinone; (B) a water-soluble organic amine (e.g., monoethanolamine, 2-(2-aminoethoxy)-ethanol, triethylene(tetramine). The application also teaches a surfactant may be added to the stripper.

12. Japanese Published Patent Application No. 64-088548, which issued to S. Shiotsu (Nagase Denshi Kagaku) on Apr. 3, 1989, teaches the use of 2-butyne-1,4-diol as a corrosion inhibitor for a positive photoresist stripper.

13. Japanese Published Patent Application No. 1-081949, which issued to K. Matsumoto (Asahi Chemical) on Mar. 28, 1989, teaches a positive-working photoresist stripper composition containing (A) gamma-butyrolactone, N-methylformamide, N,N-dimethylformamide, N,N-dimethyl-acetoamide or N-methylpyrrolidone; (B) an amino alcohol (e.g., N-butyl-ethanolamine and N-ethyldiethanolamine); and (C) water.

14. Japanese Published Patent Application No. 4-124668, which issued to K. Wakiya (Tokyo Ohka) on Apr. 24, 1992, teaches the use of a phosphoric acid group containing surfactant as a corrosion inhibitor in a photoresist stripper.

15. Japanese Published Patent Application No. 4-350660, which issued to H. Goto (Texas Instruments, Japan and Kanto Chemical, Inc.) on Dec. 4, 1992, teaches a stripper for positive photoresists comprising (A) 1,3-dimethyl-2-imidazolidinone (DMI), (B) dimethylsulfoxide (DMSO) and (C) a water-soluble amine (e.g., monoethanolamine or 2-(2-amino-ethoxy)ethanol wherein the amount of the water-soluble amine is 7–30% by weight.

16. Japanese Published Patent Application No. 5-045894, which issued to Ward (ACT, Inc.) on Feb. 26, 1993, teaches the use of 6-hydroxyquinoline as a corrosion inhibitor in a positive photoresist stripper.

None of these references suggest the addition of such a chelating type corrosion inhibitor that has a monovalent or polyvalent carboxylic acid group and is readily soluble in organic solvents such as N-methylpyrrolidone, N,N'-dimethyl-2-imidazolidinone, or related polar organic solvents. Ethylenediamine tetraacetic acid (EDTA), which is one of typical polyvalent carboxylic acid-containing chelating reagents, was disclosed as a stripper ingredient in U.S. Pat. No. 5,334,332, which issued to Wai M. Lee on Aug. 2, 1994, however, EDTA and its analogues have poor solubility in organic solvents that are usually used in stripper formulations. Thus EDTA and its analogues do not perform well as corrosion inhibitors.

BRIEF SUMMARY OF THE INVENTION

A non-corrosive positive photoresist stripper composition which is comprising:

(a) a solvent selected from the group consisting of N-methyl-2-pyrrolidone, N-hydroxyethyl-2-pyrrolidone, 1,3-dimethyl-2-imidazolidinone dimethylsulfoxide, and admixtures thereof;

(b) a corrosion inhibitor selected from the group consisting of tricine, bicine, (2-benzothiazolylthio)succinic acid, and admixtures thereof;

(c) optionally, an alkanolamine selected from diethyleneglycolamine, monoethanolamine, diethanolamine, triethanolamine, and admixtures thereof;

(d) optionally, water; and (e) optionally, at least one water-soluble surface active compound.

DESCRIPTION OF THE PREFERRED EMBODIMENTS

As stated above, the non-corrosive stripper of the present invention has two critical components, namely:

(a) one or more selected polar solvents;

(b) one or more selected corrosion inhibitors.

The solvents used in this stripper composition are N-methyl-2-pyrrolidone (NMP), N-hydroxyethyl-2-pyrrolidone (HEP), 1,3-dimethyl-2-imidazolidinone (DMI), and dimethylsulfoxide (DMSO). These solvents are especially effective from a view point of stripping power and toxicity.

A particularly preferred solvent mixture is an admixture of HEP with NMP, DMI, or DMSO wherein the mixing ratio of HEP to NMP, DMI or DMSO is from about 10:90% to about 90:10% by weight as HEP is a known safer and viscous solvent while NMP, DMI, and DMSO are powerful stripping solvents with low viscosity; the stripping power is, in general, increased by lowering the viscosity of a stripper solution.

The second essential component of the stripper composition of this invention is tricine, bicine, and (2-benzothiazolylthio)succinic acid. Tricine (also known as N-[tris(hydroxymethyl)methyl]glycine) has the following chemical formula:

Bicine is also known as diethylolglycine or N,N-bis(2-hydroxyethyl)glycine or N,N-di(hydroxyethyl)aminoacetic acid has the following chemical formula:

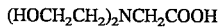

The third corrosion inhibitor has the following chemical formula:

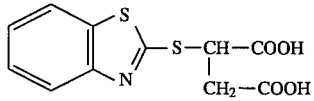

It is commercially available from Ciba-Geigy Ltd. as IRGACOR 252. It is known to work as a corrosion inhibition in the area of paints but never tested in the area of the photoresist stripper.

These three compounds have been found to effectively inhibit the corrosion without any damage of the stripping power. These are superior to other known corrosion inhibitors in that they have a good balance of the various functional and economic requirements, namely, the following:

(a) excellent prevention of metal contamination of substrate surfaces;

(b) favorable material cost for the desired corrosion inhibition effect.

As mentioned above, an optional component of the stripper is one or more amine compounds. Alkanolamines selected from the group consisting of diethyleneglycolamine (DEGA), monoethanolamine (MEA), diethanolamine (DEA), triethanolamine (TEA), and admixtures thereof.

It is also optional to add water and watersoluble surface-active agents such as polycarboxylated ethylene oxide condensates of fatty alcohols manufactured by Olin Corporation of Stamford, Conn. under the trade name of "POLY-TERGENT® CS-1".

The preferred amounts of these ingredients are about 25–99.9% polar solvent; about 0.1–4.5% corrosion inhibitor; about 0–70% amine compound; 0–10% water; and 0–5% surface-active compound; all based on the weight of the stripper composition. The more preferred amounts of these ingredients are about 40–99% polar solvent; about 0.5–3.0% corrosion inhibitor; and if used, about 1–50% amine compound; about 0.5–5% water; about 0.05–1% surface-active compound; all based on the weight of the stripper composition.

Various other ingredients known to those skill in the art may optionally be included in the stripping composition e.g. dyes or colorants, wetting agents, antifoamers and so forth. Generally, the amount of each of these optional ingredients would be about 0.1–0.5% by weight, based on the total stripper composition.

The described stripping composition is used in removing an organic polymeric material from a substrate. The method of the invention is carried out by contacting an organic polymeric material with the described stripping composition. The actual conditions, i.e., temperature, time, and the like, may vary over wide ranges and are generally dependent on the nature and thickness of the organic polymeric material to be removed, as well as other factors familiar to those skilled in the art. In general, however, temperatures ranging from about 25° C. to about 100° C. for a period of about 10 minutes to about 60 minutes are typical.

A variety of means can be employed in contacting the organic polymeric material with the stripping composition in the practice of the invention. For example, the substrate containing the organic polymeric material can be immersed in a stripping bath or the stripping composition can be sprayed over the surface of the organic polymeric material, as will be apparent to those skilled in the art.

The stripper composition of the invention is effective in removing a wide variety of organic polymeric materials from substrates. Exemplificative organic polymeric materials include positive- and negative-working g/i-line and deep UV resists, electron beam resists, X-ray resists, ion beam resists, as well as organic dielectric materials such as polyimide resins, and so forth. Specific examples of organic polymeric materials which can be removed in the practice of the invention include positive resists containing phenol-formaldehyde resins or poly(p-vinylphenol); negative resists containing cyclized polyisoprene or poly(p-vinylphenol); and polymethylmethacrylate-containing resists. In particularly preferred embodiments of the invention, the stripping composition has been found to be highly effective in removing positive resists containing a novolak resin and a diazo ketone sensitizer, e.g., ortho naphthoquinone diazide sulfonic acid ester; resists of this type include HPR 204 Series POSITIVE RESIST, HPR 504 Series POSITIVE RESIST, OIR32 Series POSITIVE RESIST, and HPR 6500 Series POSITIVE RESIST, all available commercially from OCG Microelectronic Materials, Inc. The organic polymeric material can be removed from any of the conventional substrates known to those skilled in the art, such as silicon, silicon dioxide, silicon nitride, polysilicon, aluminum, aluminum alloys, copper, copper alloys, polyimides, and so forth.

The present invention is further described in detail by means of the following Example and Comparison. All parts and percentages are by weight and all temperatures are degrees Celsius unless explicitly stated otherwise.

EXAMPLE 1

Silicon wafers, 6 inch in diameter, were used for the following stripping tests which were carried out at 90° C. for 10 minutes in a quartz tank without recirculation or filtration. After the processing, the wafers were immediately rinsed with deionized water in an overflow tank for 10 minutes at room temperature and spun dry.

The stripping efficiency was determined by measuring the amount of residues left on the wafers by using the particle counter, a Censor ANS 100 after the removal of a photoresist film with a stripper solution which consists of NMP, 48.5 g; DEGA, 48.5 g; and tricine 3.0 g, at 3.0 wt. % to the total stripper weight. For this measurement, OCG positive i-line photoresist, OIR32, was spun coated on the wafers, followed by exposure, baked at 150° C. for 15 minutes, and developed with tetramethylammonium hydroxide-containing developer before the plasma etching and the stripping in the stripper solution. The remaining residues on the wafers after the stripping were detected as Light Point Defect (LPD) with a Censor ANS100 light scattering equipment. LPD's which are bigger than 0.30 micron in diameter were measured as residual LPD to evaluate the stripping efficiency.

The corrosion of Al/Cu/Si alloy was evaluated on blanket layers. The change in the sheet resistance of the blanket layers was measured by 4 point probe. The corrosion parameter, dt, was calculated by using the following equation:

$$dt = P\left(\frac{1}{Rs(B)} - \frac{1}{Rs(A)}\right)$$

where P is the bulk resistivity of the metal film in ohm-cm, Rs(B) is the sheet resistance in ohm/square before the stripping, and Rs(A) is the sheet resistance in ohm/square after the stripping.

The results are summarized in Table 1.

EXAMPLE 2

The stripping test conditions were the same as described in Example 1, except that the stripper composition in this example was a mixture of HEP (48.5 g), DEGA (48.5 g), and bicine (3.0 g). The test result is shown in Table 1 with other examples and references.

EXAMPLE 3

The stripping test conditions were the same as described in Example 1, except the stripper composition in this example was a mixture of HEP (24.25 g); DMSO (24.25 g); DEGA (48.5 g); tricine (1.5 g); and bicine (1.5 g). The results of the testing are also given in Table 1.

EXAMPLE 4

The stripping test conditions of Example 1 were repeated, except the stripping composition in this Example was a mixture of HEP (24.625 g); DMI (24.625 g); TEA (49.5 g);

IRGACOR 252 (1.0 g); and CS-1 Surfactant (0.5 g). The results of this testing are also given in Table 1.

REFERENCE 1

The stripping test conditions were the same as described in Example 1, except that the stripper composition in this comparison example was a mixture of NMP (50 g) and DEGA (50 g) without any additive.

REFERENCE 2

The stripping test conditions were the same as described in Example 1, except that the stripper composition in this comparison example as a mixture of HEP (25 g), DMI (25 g), and TEA (50 g). The results of this experiment are also given in Table 1.

TABLE 1

| Example No. | Stripping Composition | Stripping Efficiency *1 | Corrosion Inhibition *2 |
|---|---|---|---|
| 1 | NMP/DEGA/Tricine | 12.4 | 65 |
| 2 | HEP/DEGA/Bicine | 20.0 | 60 |
| 3 | HEP/DMSO/DEGA/Tricine/Bicine | 18.5 | 63 |
| 4 | HEP/DMI/TEA/Irgacor 252/CS-1 | 16.7 | 53 |
| Refer. 1 | NMP/DEGA | 0.73 | 85 |
| Refer. 2 | HEP/DMI/TEA | 2.45 | 80 |

Footnotes:
*1 The stripping efficiency was determined by the residual particle measurement as described in Example 1. The numbers indicate the amount of surface particle (#/cm2).
*2 The corrosion inhibition was determined by the resistance measurement as described in Example 1. The numbers indicate the value of dt (nm).

The following can be concluded from the results shown in Table 1:

(a) The corrosion is significantly inhibited by the addition of tricine, bicine, or IRGACOR 252 to the same extent in comparison with the references which have no corrosion inhibitors.

(b) The stripping efficiency is, however, a little degraded by the addition of the corrosion inhibitors. But the degradation of the stripping efficiency is considered to be acceptable in the actual process of the stripping of photoresists.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A non-corrosive positive photoresist stripper composition comprising:

(a) solvent selected from the group consisting of N-methyl-2-pyrrolidone, N-hydroxyethyl-2-pyrrolidone, 1,3-dimethyl-2-imidazolidinone, dimethylsulfoxide, and admixtures thereof;

(b) a corrosion inhibitor selected from the group consisting of tricine, bicine, (2-benzothiozolylthio)succinic acid, and admixtures thereof;

(c) optionally, an alkanolamine selected from the group consisting of diethyleneglycolamine, monoethanolamine, diethanolamine, triethanolamine, and admixtures thereof;

(d) optionally, water; and (e) optionally, a water-soluble surface active compound.

2. The non-corrosive positive photoresist stripper composition of claim 1 wherein:

(a) said solvent is in a concentration from 25 to 99.9%;

(b) said corrosion inhibitor is in a concentration from 0.1 to 4.5%;

(c) said alkanolamine is in a concentration from 0 to 70%;

(d) water is in a concentration from 0 to 10%;

(e) said surface active compound is in a concentration from 0 to 0.5%; all percentages based on weight as to the total weight of the stripper composition.

3. A non-corrosive positive photoresist stripper composition of claim 1 wherein said solvent is an admixture of N-hydroxyethyl-2-pyrrolidone with N-methyl-2-pyrrolidone, 1,3-dimethyl-2-imidazolidinone, or dimethylsulfoxide at a blend ratio from about 10/90 to about 90/10 by weight.

4. A non-corrosive positive photoresist stripper composition of claim 1 wherein said amine is an admixture of diethyleneglycolamine with monoethanolamine, diethanolamine, or triethanolamine at a blend ratio from about 10/90 to about 90/10 by weight.

* * * * *

UNITED STATES PATENT AND TRADEMARK OFFICE
CERTIFICATE OF CORRECTION

PATENT NO. : 5,597,678
DATED : January 28, 1997
INVENTOR(S) : Kenji Honda et al.

It is certified that error appears in the above-indentified patent and that said Letters Patent is hereby corrected as shown below:

At column 1, line 11, please delete "in-art" and insert instead --in part--.

At column 1, line 23, please delete "(2) a selected corrosion inhibitors" and insert instead --(2) selected corrosion inhibitors--.

Signed and Sealed this

Twelfth Day of August, 1997

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,597,678
DATED : January 28, 1997
INVENTOR(S) : Kenji Honda, et al.

It is certified that error appears in the above-identified patent and that said Letters Patent is hereby corrected as shown below:

On the title page, delete item [73] Assignee:

"OCG Microelectronic Materials, Inc.
West Paterson, N.J."

and insert instead

--Olin Microelectronic Chemicals, Inc.
Cheshire, CT--.

Signed and Sealed this

Second Day of December, 1997

Attest:

BRUCE LEHMAN

*Attesting Officer*     *Commissioner of Patents and Trademarks*